(12) United States Patent
Jung et al.

(10) Patent No.: US 6,486,055 B1
(45) Date of Patent: Nov. 26, 2002

(54) METHOD FOR FORMING COPPER INTERCONNECTIONS IN SEMICONDUCTOR COMPONENT USING ELECTROLESS PLATING SYSTEM

(75) Inventors: Chan-Hwa Jung, Gyeonggi-do (KR); Sung-Min Cho, Gyeonggi-do (KR); Youn-Jin Oh, Seoul (KR)

(73) Assignee: Sungkyunkwan University (KR)

( * ) Notice: Subject to any disclaimer, the term of this patent is extended or adjusted under 35 U.S.C. 154(b) by 0 days.

(21) Appl. No.: 10/097,308

(22) Filed: Mar. 15, 2002

(30) Foreign Application Priority Data

Sep. 28, 2001 (KR) ...................... 2001-0060732

(51) Int. Cl.⁷ ...................... H01L 21/4763; H01L 21/44
(52) U.S. Cl. ...................... 438/618; 438/622; 438/677; 438/678; 438/687
(58) Field of Search ...................... 438/618, 622, 438/627, 633, 648, 650, 674, 677, 678, 687

(56) References Cited

U.S. PATENT DOCUMENTS 5,111,278 A * 5/1992 Eichelberger ............... 257/698
6,225,221 B1 * 5/2001 Ho et al. .................... 438/687
6,319,728 B1 * 11/2001 Bhan et al. ................. 438/687
6,368,484 B1 * 4/2002 Volant et al. ............... 205/220
6,395,642 B1 * 5/2002 Liu et al. .................... 438/720

* cited by examiner

Primary Examiner—T. N. Quach
(74) Attorney, Agent, or Firm—Burns, Doane, Swecker & Mathis, LLP

(57) ABSTRACT

Disclosed is a method for forming copper interconnections of a semiconductor component using an electroless plating system, which enables copper to be grown only in corresponding interconnection regions. In such a method, a wafer is cleaned, the wafer is pretreated with a metal seed solution so as to cause spontaneous catalytic activation and simultaneously the process temperature is varied to grow metal seed particles from the metal seed pretreating solution, the wafer is cleaned to remove the metal seed from the wafer surface, and the wafer is finally plated with an electroless plating bath to grow copper in the metal seed formed regions. This method simplifies the processes and reduces process costs by substituting a wet process for the existing vacuum pretreating process. Also, a wafer planarization process can be omitted by selectively growing copper only in desired interconnections. Compared with the existing ultraviolet radiation photo process, the selective copper growth process of the method has an advantage of being much simpler.

10 Claims, 13 Drawing Sheets

METHOD FOR FORMING COPPER INTERCONNECTIONS IN SEMICONDUCTOR COMPONENT USING ELECTROLESS PLATING SYSTEM

BACKGROUND OF THE INVENTION

1. Field of the Invention

The present invention relates to a method for forming copper interconnections in a semiconductor component using an electroless plating system, and more particularly to such a method, in which a metal seed for growing copper interconnections is subjected to a selective pretreating process, so as to grow copper only in corresponding interconnection regions.

2. Description of the Prior Art

Up to the present, aluminum (Al) and tungsten (W) have been used for metal interconnection process in semiconductor components, but copper (Cu) having lower resistance and better metal properties has recently been used as a substitute and many studies on copper interconnection processes are now in progress. A copper deposition process by use of an electrolytic plating system is already employed in some semiconductor components. The copper deposition method includes a chemical vapor deposition (CVD) system, a sputtering system, an electrolytic plating system and so forth. The conventional vacuum deposition systems, however, have many difficulties in developing copper metal-organic compounds and the sputtering system has problems including its incapability to form a uniform copper film.

A description will be given here for a conventional copper interconnection process in a semiconductor component.

FIGS. 1A and 1B are schematic sectional views showing the conventional process of forming copper interconnections. Referring to FIGS. 1A and 1B, interconnections with various shapes are fabricated by growing an interlayer dielectric (ILD) film 2 on a silicon wafer 1 and performing a photo process and an etching process to form via holes and trenches. The interlayer dielectric film 2 is formed using a silicon oxides ($SiO_2$) film or a fluorosilicate glass (FGS) film, i.e., a silicon oxyfluoride (SiOF) film. After a cleaning process, a metal diffusion barrier (Ta, Ti, TaN, TiN) layer 3 with a predetermined thickness is then deposited on the interlayer dielectric film 2 by a sputtering method. At this time, if the via holes have high aspect ratios, a collimated system capable of improving step coverage is used in the sputtering deposition of the layer to be bonded.

After a thin copper seed layer 4 is deposited on the metal diffusion barrier layer 3 by the sputtering method, a copper interconnection layer 5a is filled in the via holes and the trenches and is further deposited over the entire regions to be processed. At this time, the copper interconnection layer 5a may be formed using an electroless plating method, an electrolytic plating method, a sputtering method or a CVD method, among which the electrolytic plating method or the CVD method shows an excellent via hole-fling characteristic. In the case of using the electrolytic plating method, the copper seed layer must be deposited in advance with a thickness of 100 to 1000Å.

Subsequently, the copper interconnection layer 5a, the metal diffusion barrier layer 3 and the copper seed layer 4 over the interlayer dielectric film 2 are removed using a chemical mechanical planarization (CMP) method or a combination of an electrolytic polishing method and the chemical mechanical planarization method in order to proceed with semiconductor component processes on the deposited copper interconnection layer. In this way, the copper 5b comes to be only in the patterned interconnections.

A process for preventing copper atoms within the copper interconnection layer 5b from diffusing into the interlayer dielectric film 2 is also performed by full deposition of a capping layer (not shown), using a silicon nitride film or the like, over the entire structure including the interlayer dielectric film 2 and the copper interconnection layer 5b.

Meanwhile, many studies have been conducted in an effort to achieve spontaneous surface activation in the electroless plating system. In general, these studies were conducted with the intention of producing a seed solution using palladium and depositing palladium particles on the wafer in various ways. Recently, a deposition system has been used, in which the wafer is coated with a palladium seed solution using a spin coating method, palladium particles are deposited in desired regions by exposing the coated wafer to a ultraviolet radiation so as to maintain palladium bonded to exposed portions of the wafer and remove palladium in non-exposed portions of the wafer using a photo process and a cleaning process and then copper is selectively deposited by performing electroless plating. This deposition system involving the photo process, however, is problematic because it is very difficult to produce an efficient palladium seed solution for the photo process.

With regard to conventional electrolytic plating being used for the metal interconnection process, there have been various difficulties including deterioration of electrical properties of the copper film due to rapid copper growth, differences in growth speed of the copper film over the surface of the wafer, formation of the copper seed film indispensable for the electrolytic plating and the like. In particular, although the electrolytic plating itself is a wet process, the preceding processes are vacuum processes, which gives rise to a disadvantage in that the number of overall plating processes is increased.

SUMMARY OF THE INVENTION

Accordingly, the present invention has been created in order to solve the above-mentioned problems occurring in the prior art, and an object of the present invention is to provide a method for forming copper interconnections of a semiconductor component using an electroless plating system, in which a metal seed for growing copper interconnections is subjected to a selective pretreating process, so as to grow copper only in corresponding interconnection regions.

That is to say, the present invention intends to grow a copper film of good quality through a surface cleaning process for a metal diffusion barrier layer and to selectively deposit copper only in a given pattern of a wafer through metal seed (gold, silver, nickel, tin, iron, palladium, etc.) pretreating and posttreating processes. In a metal seed treating process using a pretreating solution containing palladium among various kinds of metal seeds, the present invention also intends to realize selective copper deposition by providing different chemical structures of palladium particles to be adsorbed and deposited on the surface depending upon composition of the solution and a process temperature to vary deposition position and size of the palladium particles according to the surface structure of the wafer and, after this palladium treating process, selectively depositing the palladium particles through wafer cleaning.

To accomplish this object, there is provided a method for forming copper interconnections of a semiconductor component using an electroless plating system in accordance with the present invention, the method comprising: a first step of cleaning a wafer in order to remove contamination sources and allow uniform copper deposition; a second step of pretreating the wafer with a metal seed solution so as to cause copper depositing regions to tend toward spontaneous catalytic activation and simultaneously varying a process temperature to grow metal seed particles from the metal seed pretreating solution, the metal seed particles having different bonding forces and sizes on a wafer surface and in interconnection forming regions; a third step of cleaning the wafer to remove the metal seed from the wafer surface; and a fourth step of plating a product obtained from the third step with an electroless plating bath to grow copper in the metal seed formed regions.

In the above-mentioned method according to the present invention, the first step comprises the sub-steps of removing organics and metallic contaminants formed on the wafer surface by cleaning the wafer using sulfuric acid and hydrogen peroxide in a weight ratio of 1 to 10:1 for a time of 1 to 10 minutes; and removing oxides formed on the wafer surface by cleaning the wafer using hydrofluoric acid and water in a weight ratio of 1 to 10:100 for a time of 1 to 2 minutes.

Also, the metal seed used as the pretreating solution for selective copper deposition of the second step is any one selected from the group consisting of palladium (Pd), gold (Au), silver (Ag), tin (Sn), nickel (Ni), iron (Fe), copper (Cu) and platinum (Pt), and the metal seed pretreating solution using palladium is composed of a mixture of 0.01 to 0.1 g/l of palladium chloride ($PdCl_2$), 3 to 20 ml of ammonia water ($NH_4OH$), 1 to 20 ml of hydrochloric acid (HCl) and 1 to 10 ml of hydrofluoric acid (HF).

In this case, it is preferable that nitric acid ($HNO_3$), as a surface oxidant, is further added to and polyethyleneglycol (PEG) and Triton, as surfactants for stabilization of the solution, is further added to the metal seed pretreating solution.

In addition, the second step of pretreating the wafer with the metal seed is performed at a process temperature of 50 to 80, thereby causing only Pd metal particles of $Pd(NH_3)_2Cl_2$ within the solution to be grown on the surface.

In accordance with the pretreating process temperature of the second step, nano size fine particles of several tens of nanometers are deposited at a normal temperature and the size of the nano size particles increases up to a size of a several hundreds of nanometers at the process temperature of 50 to 80° C.

On the other hand, a procedure for preparing the electroless plating bath prior to the copper electroless plating of the fourth step comprises the steps of a) adding copper sulfate pentahydrate and EDTA to a water solvent and then stirring the solvent to produce a solution; b) adjusting solution pH to an alkaline state by TMAH prior to putting HCHO into the solution in order to prevent a side reaction by which HCHO is rapidly converted into methanol in an acidic state; c) adding HCHO to a product obtained from step b); d) putting other additives into the solution; and e) adjusting solution pH to a value of 12 to 13 by TMAH and then stirring the solution.

Preferably, the copper electroless plating is conducted at a temperature of 50 to 80° C.

Following the electroless plating process of the fourth step, it is preferable to further performing a planarization (CMP) process for posttreating processes.

BRIEF DESCRIPTION OF THE DRAWINGS

The above and other objects, features and advantages of the present invention will become more apparent from the following detailed description taken in conjunction with the accompanying drawings, in which:

FIGS. 11A to 1E are schematic sectional views showing a procedure in which the copper electroless plating is performed after the palladium pretreating process and the subsequent cleaning process;

DETAILED DESCRIPTION OF THE PREFERRED EMBODIMENTS

Hereinafter, preferred embodiments of the present invention will be described with reference to the accompanying drawings.

Figure 2:
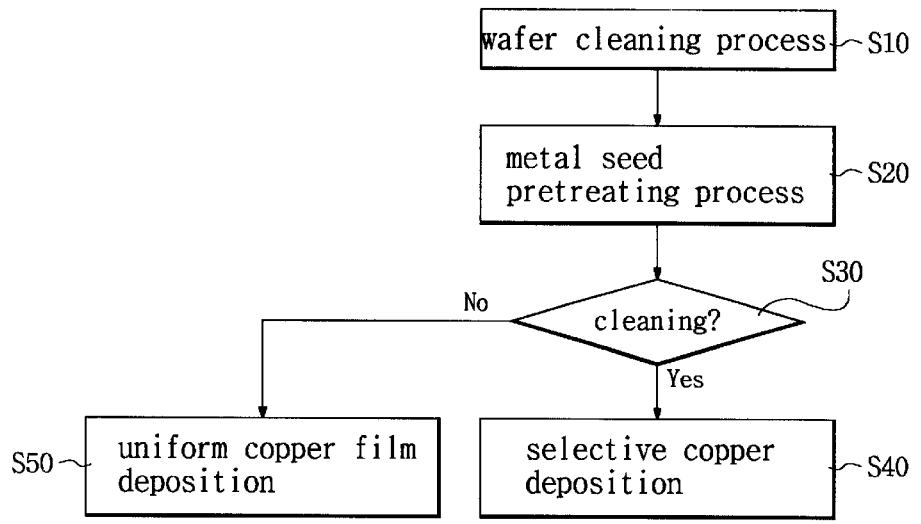
FIG. 2 is a flow chart of a copper deposition process in accordance with a preferred embodiment of the present invention.

FIG. 2 is a flow chart of a copper deposition process in accordance with the present invention.

Herein, conventional procedures for growing an interlayer dielectric (ILD) film, forming via holes and trenches through a photo process and an etching process, and depositing a metal diffusion barrier layer are similarly to those performed in the present invention, and thus repetition of the description of those procedures will be omitted.

Referring to FIG. 2, two pretreating processes are performed in advance of copper electroless plating. Of these pretreating processes, a wafer cleaning process is performed first in order to remove organic contaminants, metallic contaminants, metal oxides or the like on a wafer surface (S10). The wafer cleaned so is further pretreated with a palladium seed solution in a metal seed pretreating process so as to cause the metal diffusion barrier layer to proceed a spontaneous surface activation reaction in an electroless plating bath (S20). In this palladium pretreating process, palladium particles are deposited on the surface in various forms depending upon a process temperature, a process time and bath composition. According to these conditions of the palladium pretreating process, the palladium particles can be selectively deposited only in desired interconnections if a cleaning process is performed (S30) after the pretreating process, which results in selective copper growth (S40). That is, copper can be selectively grown only on a pattern of the wafer. On the other hand, copper is uniformly deposited on the surface if the copper electroless plating is performed without the cleaning step (S50).

Figure 3A:
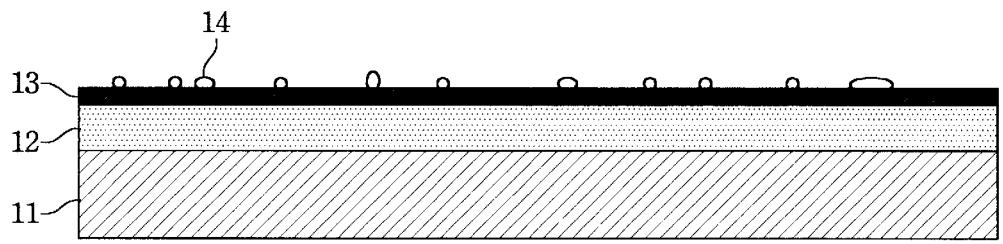
FIGS. 3A and 3B are schematic sectional views showing states where contaminants are formed on a metal diffusion barrier layer and are removed from the metal diffusion barrier layer by cleaning, respectively.
Figure 3B:

FIGS. 3A and 3B are schematic sectional views showing states in which contaminants are formed on the metal diffusion barrier layer and are removed from the metal diffusion barrier layer by cleaning, respectively. Referring to the drawings, reference numerals "11", "12" and "13" designate the silicon wafer, the interlayer dielectric film and the metal diffusion barrier layer, respectively. Reference numeral "14" represents all kinds of contaminants, such as metallic contaminants, organic contaminants and metal oxides ($TiO_2$, TiO, TaO, $TaO_2$, . . . ), appearing due to exposure of the metal diffusion barrier layer 13 to the atmosphere,. If the cleaning process occurs, such contaminants on the metal diffusion barrier layer 13 are removed as shown in FIG. 3b.

The cleaning process for the metal diffusion barrier layer will be explained here in detail.

Figure 4:
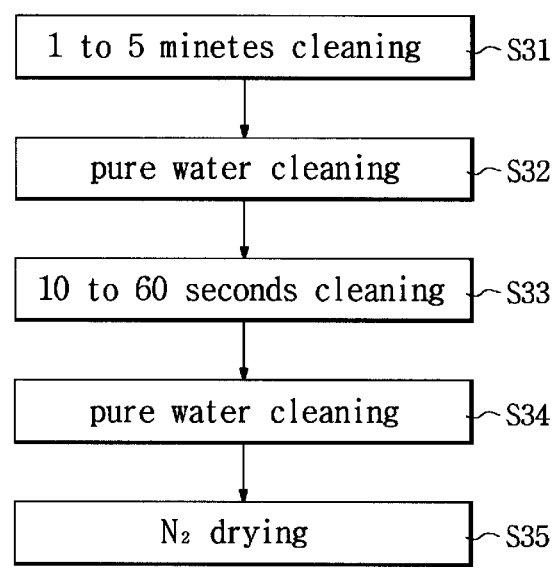
FIG. 4 is a flow chart of a wafer cleaning process in accordance with a preferred embodiment of the present invention.

FIG. 4 is a flow chart of the wafer cleaning process in accordance with a preferred embodiment of the present invention. As stated above, if the metal diffusion barrier layer deposited on the wafer is exposed to the atmosphere, organic or metallic contaminants occur on its surface. Metal oxides are also formed on the surface as it is oxidized. When copper is deposited through an electroless plating process, such contaminants have a fatal influence on the quality of the deposited copper film. First of all, the metal diffusion barrier layer loses its capability to function as a spontaneous catalyst for the copper deposition and the copper film is not deposited uniformly. Furthermore, the bonding force between the metal diffusion barrier layer and the deposited copper film becomes poor. For this reason, these contaminants must be removed through a cleaning process, which removes organic and metallic contaminants using sulfuric acid and removes metal oxides are removed using hydrofluoric acid.

First, as shown in FIG. 4, organic and metallic contaminants adhered to the metal diffusion barrier layer are removed first by dipping the wafer in a sulfuric acid/hydrogen peroxide solution of a certain composition ratio for 1 to 5 minutes (S31). After the wafer is cleaned in the sulfuric acid/hydrogen peroxide solution, the solution is rinsed with ultra-pure water (de-ionized (DI) water) (S32).

In the subsequent cleaning process for removing metal oxides from the metal diffusion barrier layer, a cleaning solution prepared by mixing of hydrofluoric acid solution and ultra-pure water in a proper ratio is used. This hydrofluoric acid cleaning is performed for 10 to 60 seconds (S33), the cleaning solution is rinsed with ultra-pure water (S34)

and then the wafer is dried in nitrogen gas (S35). Following this, the surface pretreating process is performed using the metal seed solution, which will be described below with reference to FIG. 5.

Figure 5A:
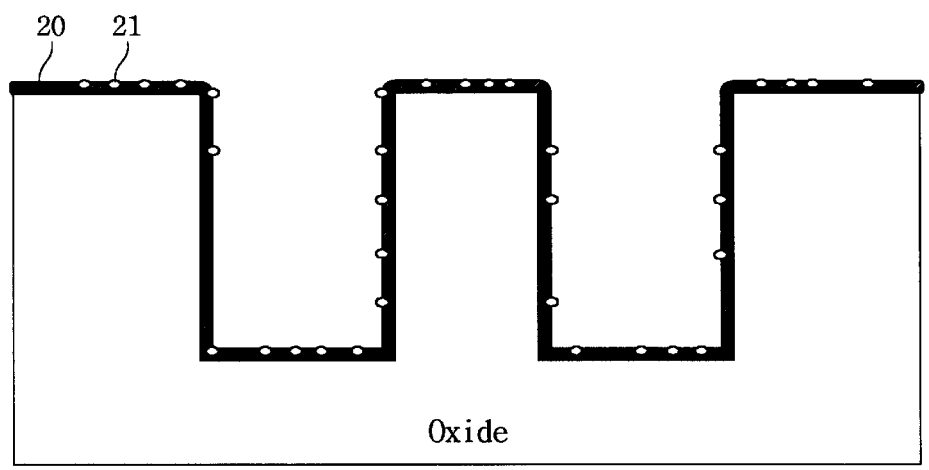
FIGS. 5A and 5B are schematic sectional views showing states where palladium compounds are formed on the metal diffusion barrier layer and are removed from the metal diffusion barrier layer by cleaning, respectively.
Figure 5B:
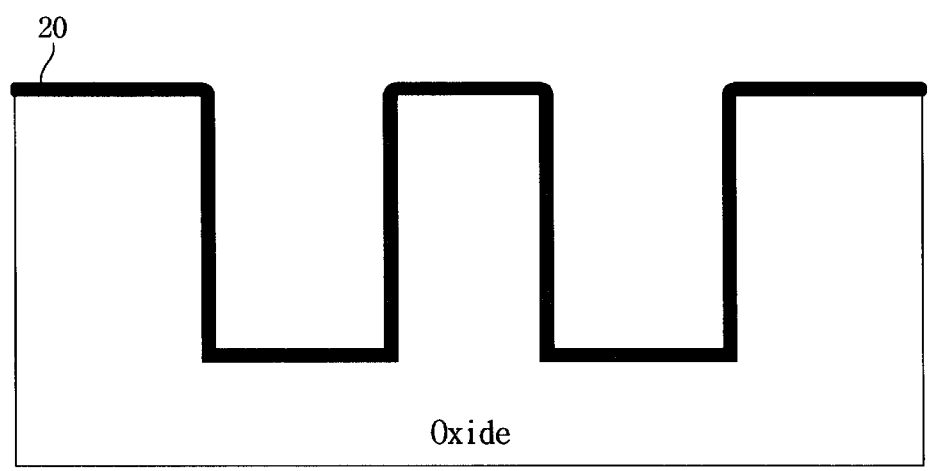

FIGS. 5A and 5B are schematic sectional views showing states in which palladium compounds are formed on the metal diffusion barrier layer and are removed from the metal diffusion barrier layer by cleaning, respectively. FIG. 5a shows a state in which the metal seed particles 21 are deposited on the surface 20 of the metal diffusion barrier layer after the metal seed pretreating process is conducted at a normal temperature.

The present commonly used copper electroless plating processes require the metal seed pretreating process to imparting a tendency of spontaneous catalytic activation to a surface on which copper is to be deposited. In general, the metal seed solution is prepared by using palladium and the surface activation process is performed in such a manner that the wafer is dipped into the metal seed solution. For example, main components used in the preparation of the palladium seed solution include palladium chloride ($PdCl_2$), ammonia water ($NH_4OH$), hydrochloric acid (HCl), hydrofluoric acid (HF) and so forth. Ions of silver (Ag), zinc (Zn), copper (Cu), and iron (Fe) are also added to the palladium seed solution.

The palladium seed solution prepared according to the present invention is composed of palladium chloride ($PdCl_2$), ammonia water ($NH_4OH$), hydrochloric acid (HCl) and hydrofluoric acid (BF). When palladium chloride is reacted with hydrochloric acid, palladium assumes a form of $[PdCl_4]^-$. At this time, the palladium seed solution changes to yellow in color. If ammonia water is added to such a solution, the solution becomes colorless and palladium in the solution exists as $Pd(NH_3)_2Cl_2$. When the wafer is pretreated using the above solution, nano size particles of palladium are uniformly deposited on the wafer surface with a particle size of several tens to several hundreds of nanometers and, in addition to pure metal palladium particles, palladium compounds such as $Pd(NH_3)_2Cl_2$ existing in the palladium seed solution are also deposited as they are. Hydrofluoric acid serves to etch oxide substances of the metal diffusion barrier layer in the solution. In the palladium seed solution used in the present invention, deposition mechanism of palladium is as follows:

$$Ti^0 + 6HF \rightarrow H_2[TiF_6]aq + 2H_2\uparrow + 4e^- \quad (1)$$

$$Pd^{2+} + 2e^- \rightarrow Pd\downarrow \quad (2)$$

In reaction formula (1), Ti is etched by HF to form $H_2[TiF_6]$aq, and simultaneously not only hydrogen gas is generated, but electrons are also emitted. The reduction of palladium ions to palladium elements by these electrons enables palladium to be deposited on the surface of the metal diffusion barrier layer. Composition of the solution is as listed in the following table.

TABLE 1

| Component | $PdCl_2$ | HCl | $NH_4OH$ | HF |
| --- | --- | --- | --- | --- |
| Quantity (per liter) | 0.2~1 g | 2.5~8 ml | 40~100 ml | 1~10 ml |

The present invention causes palladium particles of different form to be deposited on the surface by varying palladium pretreating process conditions such as a process temperature. In the case of performing the palladium pretreating process at a normal temperature, the palladium particles adsorbed on the metal diffusion barrier layer together with the palladium particles reduced in the solution exist as $Pd(NH_3)_2Cl_2$ in large quantities. Since this palladium compound is easily soluble in water, as shown in FIG. 5B, all of the palladium particles on the metal diffusion barrier layer 20 are removed if the wafer cleaning is conducted after the palladium pretreating process.

As mentioned above, the palladium particles deposited on the wafer have a smaller size of several tens of nanometers when the pretreating process is conducted at a normal temperature, but raising the process temperature accelerates a deposition speed of the palladium particles and thus increase the particle size up to several hundreds of nanometers. This is conceptually well shown in FIG. 6.

Figure 6:
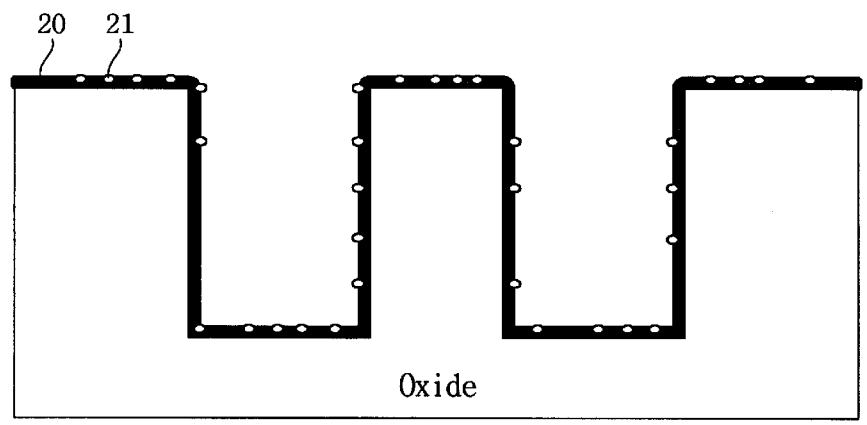
FIG. 6 is a conceptual view showing a correlation between a process temperature and a palladium particle size.
Figure 6:
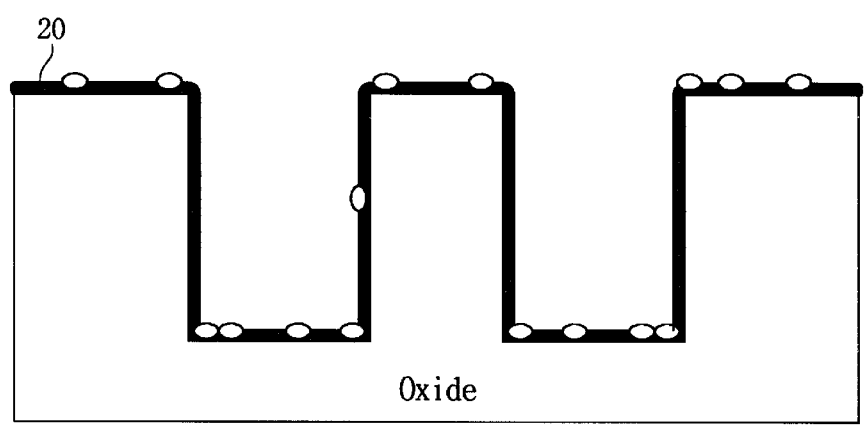
Figure 6:
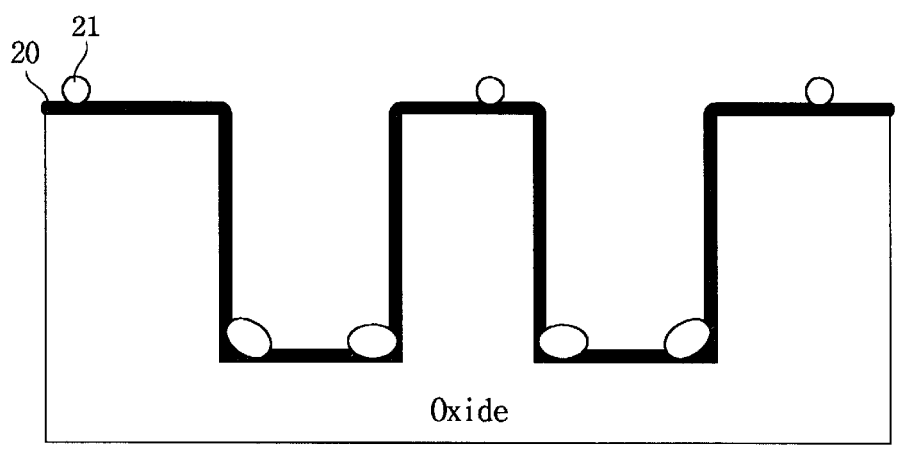

FIG. 6 is a conceptual view showing a correlation between the process temperature and the palladium particle size. As shown in the drawing, the palladium particles 21 exhibit a difference in their size according to the temperature of the palladium pretreating process. The palladium particles deposited at a normal temperature have a size of several tens of nanometers, but the particle size is increased up to several hundreds of nanometers as the process temperature goes higher. In this state, a cleaning process is performed for selectively removing the palladium particles adsorbed on the wafer surface as distinguished from the palladium particles adsorbed in the pattern of the wafer, which is well illustrated in FIG. 7.

Figure 7:
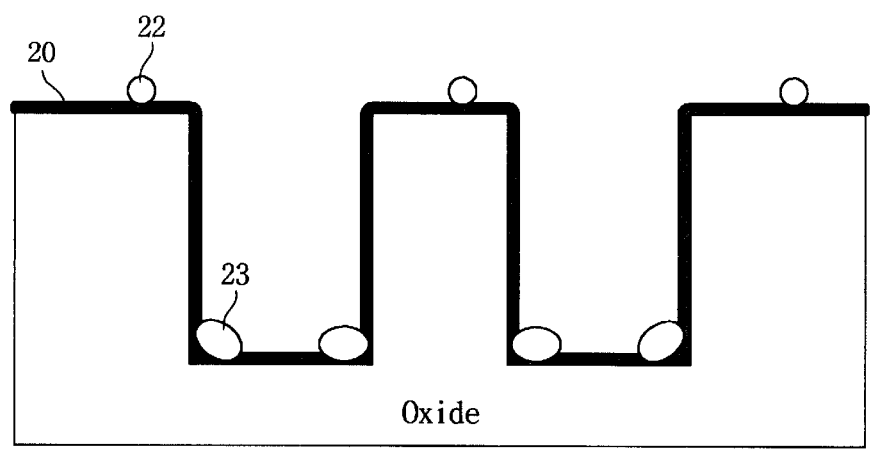
FIG. 7 is a schematic view showing how palladium particles grow as the palladium pretreating process temperature increases and a state where the palladium particles are cleaned.
Figure 7:
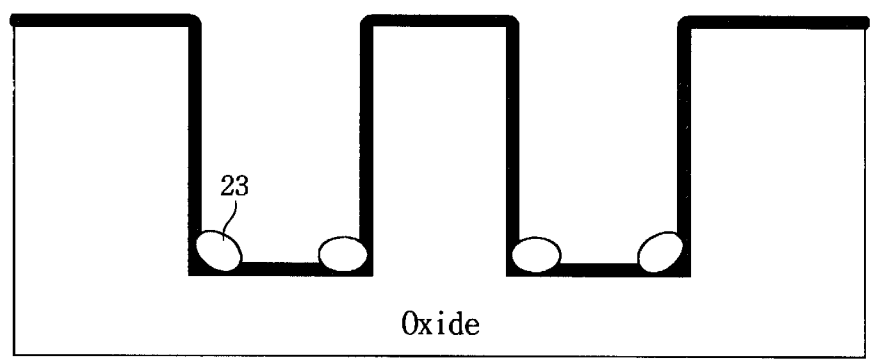

FIG. 7 is a schematic view showing palladium particles grown as the palladium pretreating process temperature is increased and a state in which the palladium particles are cleaned. The temperature of the palladium pretreating process in accordance with the present invention is between a normal temperature (30 to 40° C.) and 80° C. and the palladium rather than as organic compounds. In addition to this, if the process temperature is elevated, the palladium particles not only have a larger size, but also are grown mainly in the pattern of the wafer as shown in FIG. 7. The palladium particles have a very strong surface adsorption force when grown within the pattern of the wafer. If the wafer is cleaned, therefore, the palladium particles 22 formed on the wafer surface are easily removed and the palladium particles 23 grown in the pattern continue to be adsorbed therein.

In the present invention as described above, the palladium seed solution is so prepared as to cause palladium to exist as $Pd(NH_3)Cl_2$ in the solution, and the process temperature is varied to deposit the palladium particles in the form of pure palladium as well as $Pd(NH_3)Cl_2$ on the wafer at a normal temperature and to grow only pure metal palladium particles at an elevated temperature.

Subsequently, the copper electroless plating process is performed for selectively growing copper depending upon the conditions of the metal seed pretreating process. In this process, copper sulfate pentahydrate ($CuSO_4 \cdot 5H_2O$), ethylenediaminetetraacetic acids (EDTA), tetraammoniumhydroxide (TMAH) and formaldehyde (HCHO) are used as reagents for copper electroless planting. In the present invention, TMAH is used for the sake of adjusting copper plating bath pH to a value of 12 to 13 and the process temperature is between 50 and 80° C. In order to prevent spontaneous copper precipitation in the plating bath, additives are also used. Furthermore, Triton X-100 as a surfactant is added to the plating bath so as to maintain stability of the plating bath. One of the very serious problems arising in the copper electroless plating is a lowering of the surface adsorption force of the deposited copper due to the fact that hydrogen gas is generated on a plating reaction surface as a reaction by product and copper is deposited on the surface without removing the hydrogen gas from the surface. To solve this problem, 2,2'-dipysidyl, which is commonly used in ordinary copper electroless plating processes, is added to the plating bath.

Figure 8:
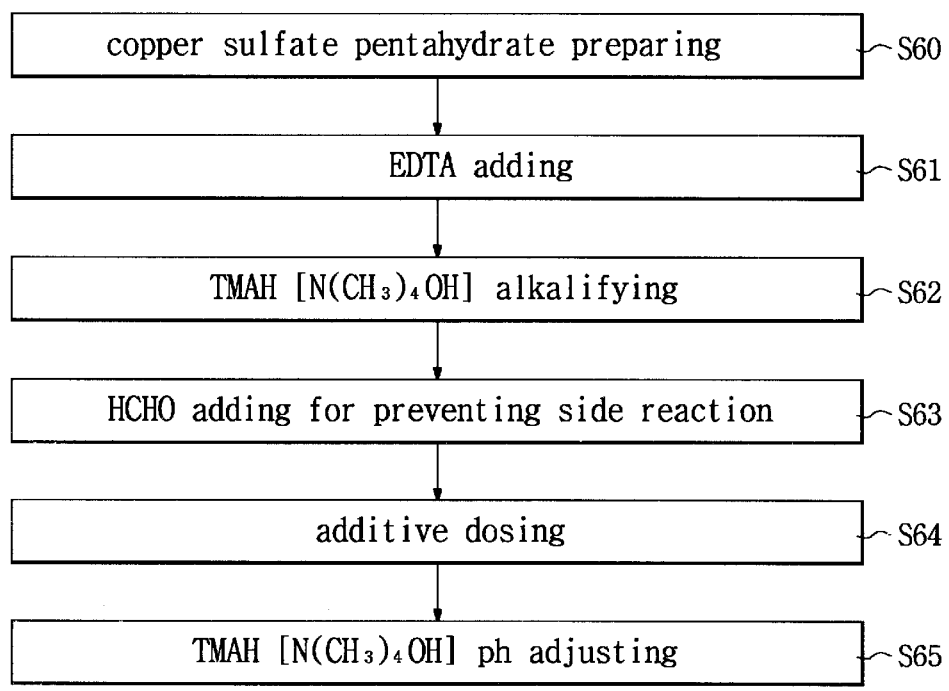
FIG. 8 is a flow chart of a procedure for preparing a copper electroless plating bath in accordance with a preferred embodiment of the present invention.
Figure 9A:
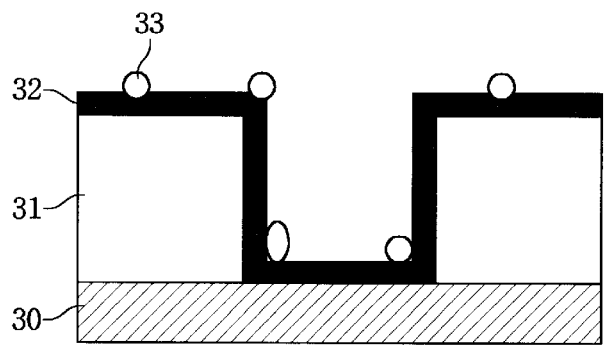
FIGS. 9A to 9D are schematic sectional views showing a process procedure in which copper electroless plating is performed without performing a cleaning process after the palladium pretreating process.
Figure 9B:
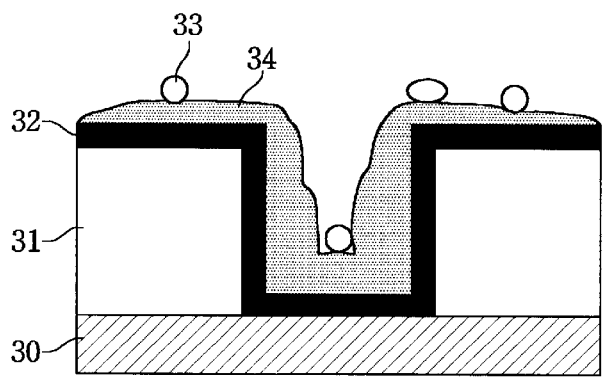
Figure 9C:
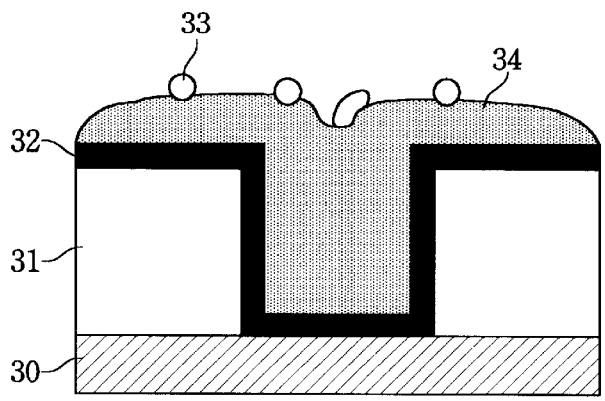
Figure 9D:
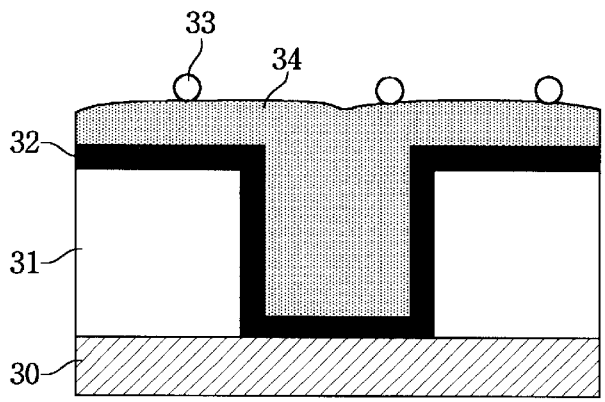

FIG. 8 is a flow chart of a procedure for preparing the copper electroless plating bath in accordance with a preferred embodiment of the present invention. As shown in the drawing, after copper sulfate pentahydrate and EDTA are added to a water solvent and then the solvent is stirred to produce a solution (S60 and S61), solution pH is adjusted to an alkaline state by adding JMAH (S62). Subsequently, HCHO is added to the solution (S63). The purpose of pH adjustment is to prevent a side reaction by which HCHO is rapidly converted into methanol in an acidic state. Thereafter, other additives are put into the solution (S64), solution pH is adjusted again to a value of 12 to 13 by TMAH (S64) and then the solution is sufficiently stirred (S65).

In the present invention, the copper electroless plating is divided into two types of copper growing processes according to the conditions of the metal seed pretreating process, in particular, the palladium pretreating process. One is a process of growing a uniform copper film by uniformly depositing the palladium particles on the wafer as in the existing copper electroless plating processes, and the other is a selective copper electroless plating process of growing copper only in the pattern of the wafer by varying the palladium process conditions to selectively locate the palladium particles only in the pattern of the wafer. Table 2 presents copper growth forms according to the palladium pretreating conditions.

TABLE 2

| Palladium process temperature | Wafer cleaning | Copper electroless plating |
| --- | --- | --- |
| Normal temperature | yes | no copper deposition |
|  | no | uniform copper film deposition |
| 30–80° C. | yes | selective copper deposition |
|  | no | uniform copper film deposition |

In the listed processes in Table 2, the copper formation is different depending upon whether or not the wafer cleaning is done.

Figure 10:
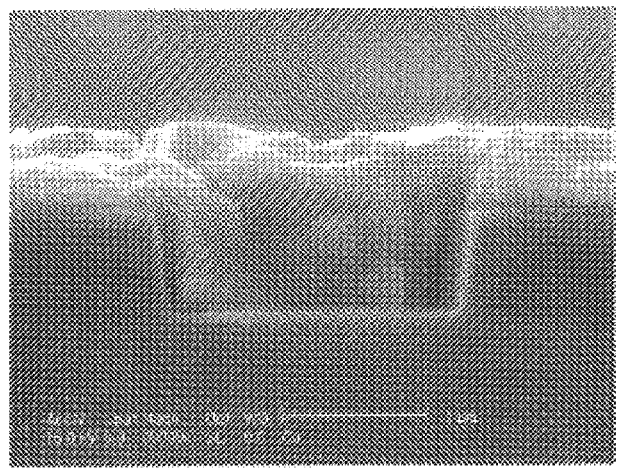
FIG. 10 is a SEM sectional picture showing a product obtained from the procedure in FIG. 9.
Figure 11A:
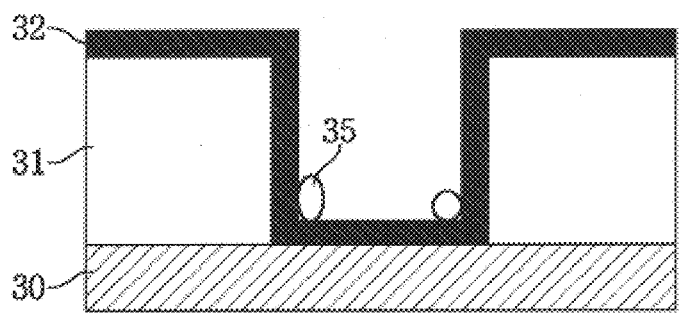
Figure 11B:
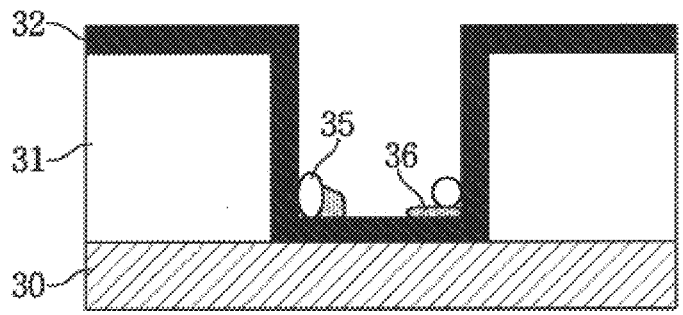
Figure 11C:
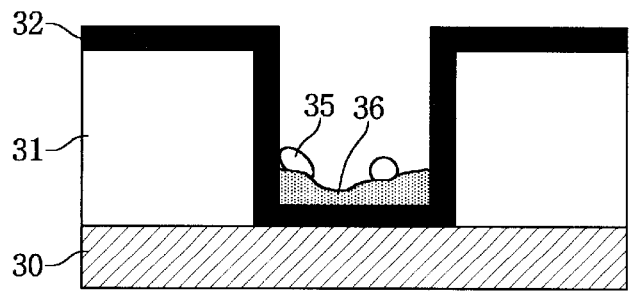
Figure 11D:
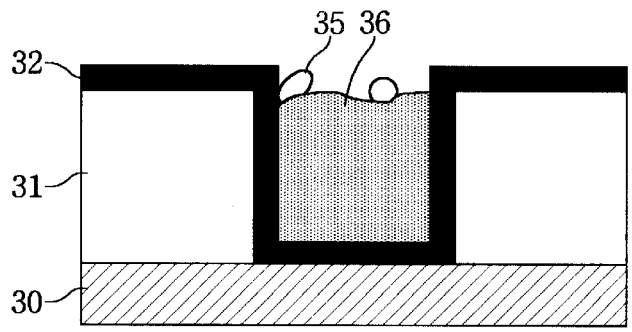
Figure 11E:
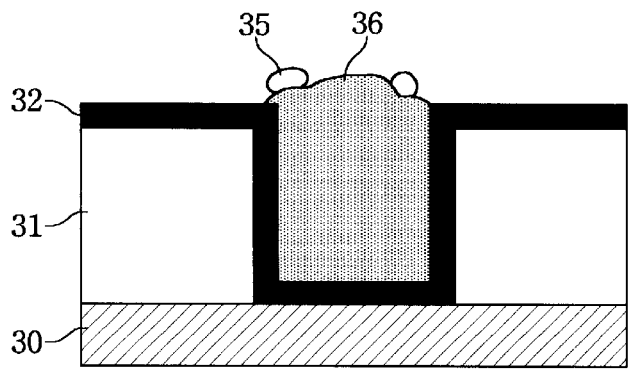

FIGS. 9A to 9D are schematic sectional views showing a process procedure in which the copper electroless plating is performed without the cleaning process after the palladium pretreating process and FIG. 10 is a SEM sectional picture showing a product obtained from the procedure in FIG. 9. If the palladium pretreating process is performed at a normal or higher temperature and then the electroless plating is performed without the wafer cleaning, copper is uniformly deposited over the entire wafer including the interior of the pattern of the wafer as shown in FIGS. 9a to 9d and FIG. 10. Also, the palladium particles 33 having served as the metal seed during the growing of the copper film come to be located only on a film surface with the copper film growth 34. Reference numerals "30", "31" and "32" designate the silicon wafer, the interlayer dielectric film and the metal diffusion barrier layer, respectively.

Figure 1A:
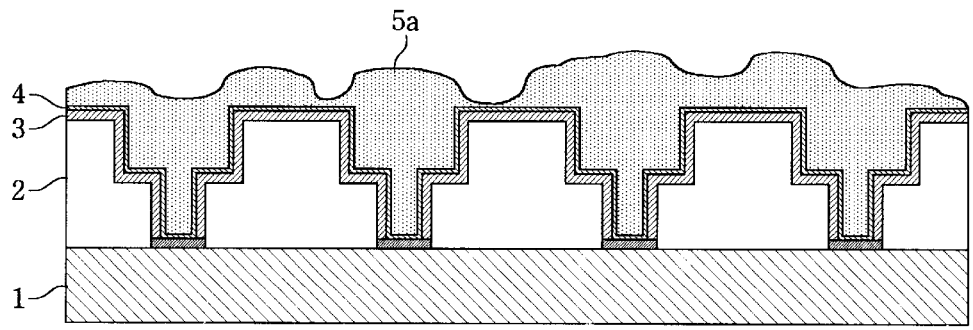
FIGS. 1A and 1B are schematic sectional views showing a conventional process of forming copper interconnections.
Figure 1B:
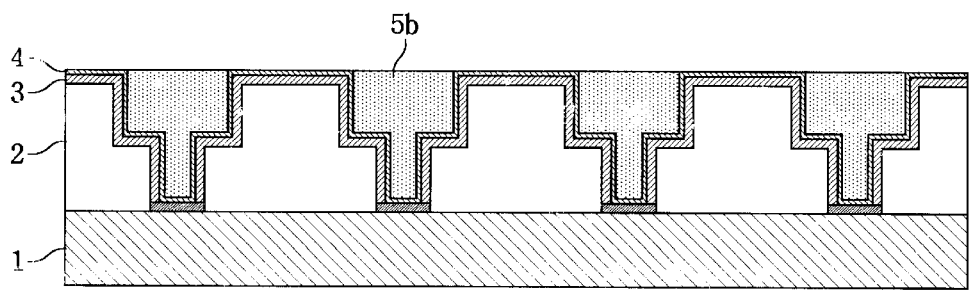
Figure 12A:
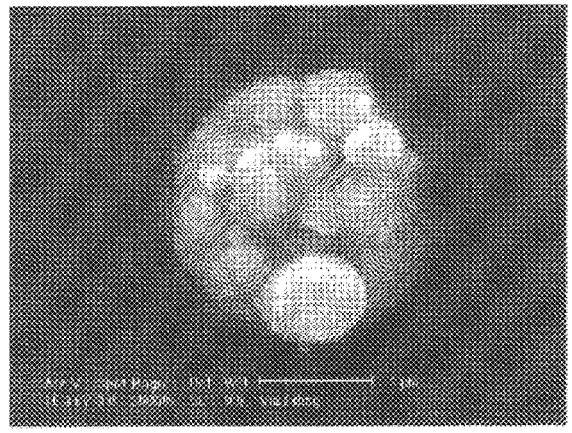
FIGS. 12A and 12B are SEM plan and sectional pictures showing a product obtained from the procedure in FIG. 11.
Figure 12B:
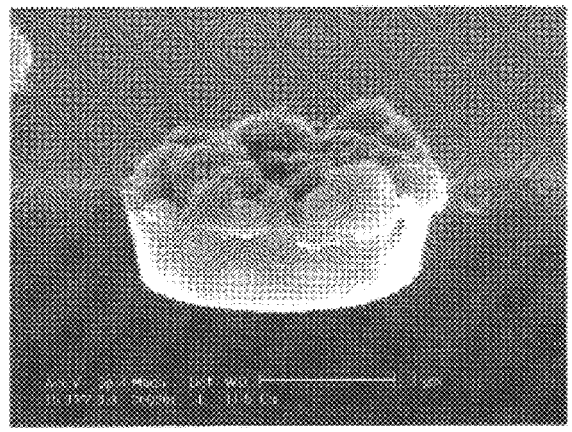

FIGS. 11A to 11E are schematic sectional views showing a process procedure in which the copper electroless plating is performed after the palladium pretreating process and the subsequent cleaning process, and FIGS. 12A and 1B are SEM plan and sectional pictures showing a product obtained from the procedure in FIG. 11. As shown in the drawings, the wafer surface is cleansed of the palladium particles and the palladium particles 35 remain only in the pattern of the wafer when the palladium pretreating process is performed at an elevated temperature of 40 to 80° C. and the wafer is cleaned. If the copper electroless plating is performed in such a state, copper is grown only in the pattern of the wafer because the palladium particles in the form of pure metal palladium are grown mainly in the pattern and the wafer surface is cleansed of the palladium particles, thus resulting in copper being grown only in the pattern where the palladium particles are located. Again, reference numerals "30", "31" and "32" designate the silicon wafer, the interlayer dielectric film and the metal diffusion barrier layer, respectively.

Figure 13A:
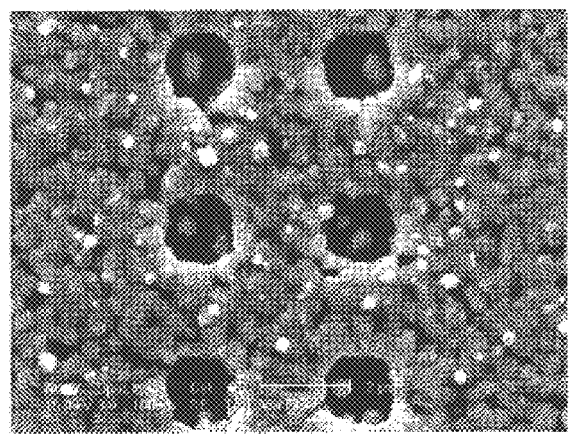
FIGS. 13A and 13B are SEM plan and enlarged pictures showing a copper film grown uniformly over the entire wafer.
Figure 13B:
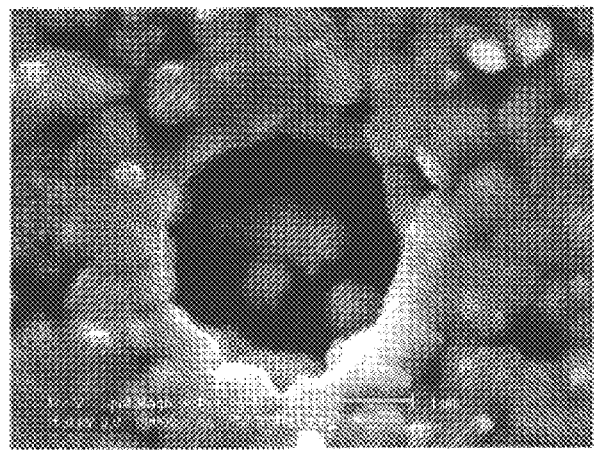
Figure 14A:
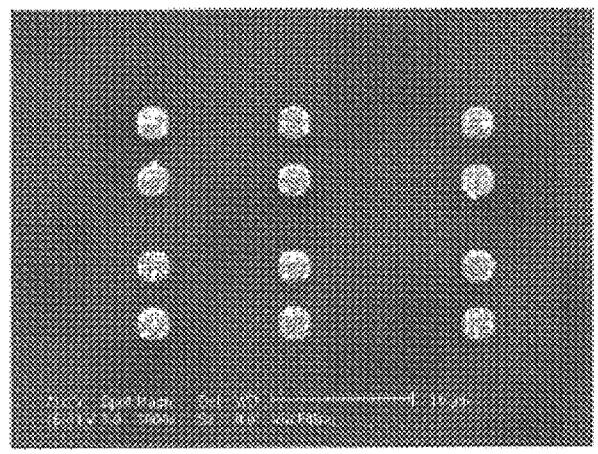
FIGS. 14A to 14D are various pictures showing copper grown only in interconnections by applying the present invention.
Figure 14B:
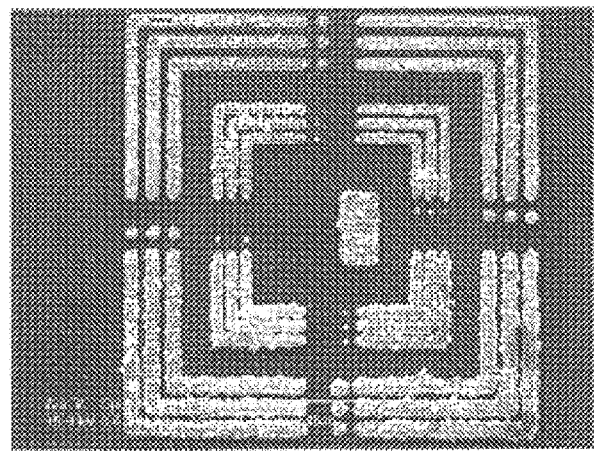
Figure 14C:
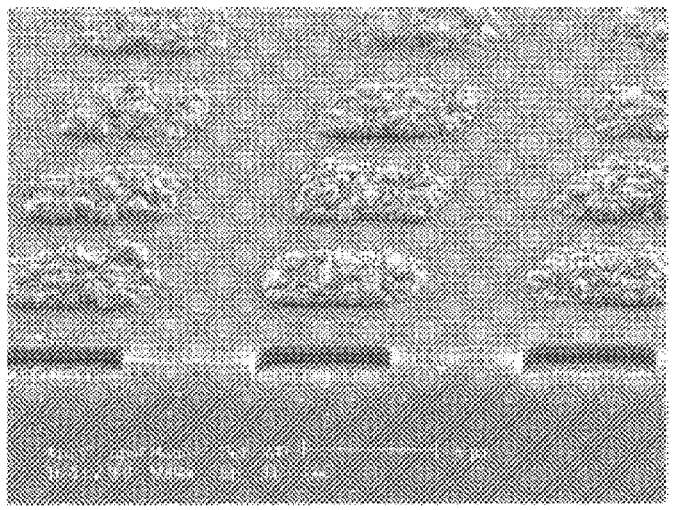
Figure 14D:
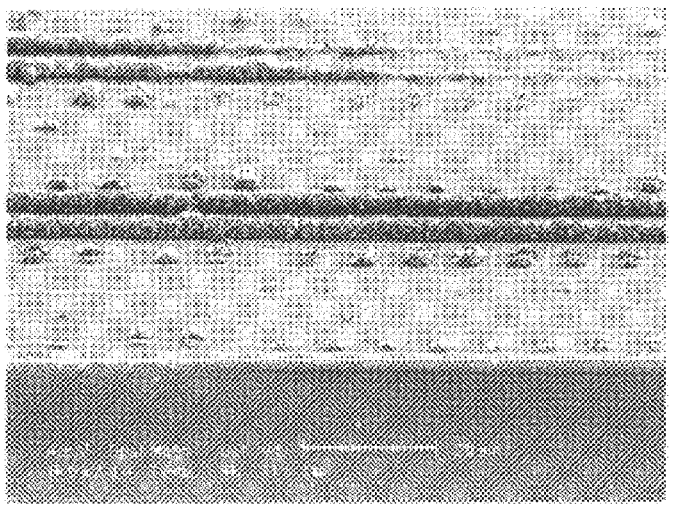

FIGS. 13A and 13B are SEM plan and enlarged pictures showing the copper film grown uniformly over the entire wafer, which were obtained by taking a photograph of an actual experimental product From the drawings, it can be seen that the copper film is uniformly grown over the entire wafer as with the existing copper electroless plating. That is, the copper film is uniformly grown on the wafer surface as well as in the pattern of the wafer.

FIGS. 14A to 14D are various pictures, also obtained by taking a photograph of an actual experimental product, showing copper grown only in interconnections by applying the present invention. It can be seen from the drawings that copper is selectively grown only in the desired interconnections.

Figure 15A:
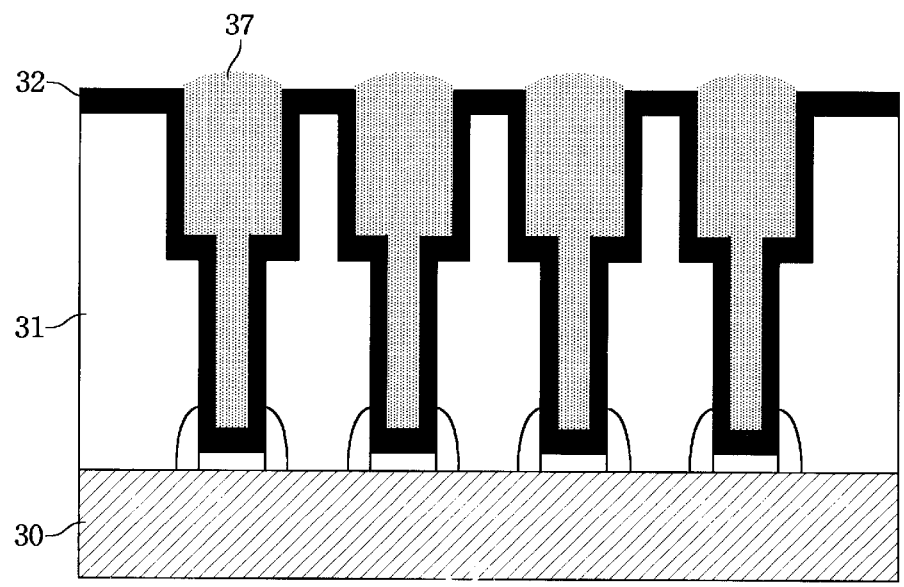
FIGS. 15A and 15B are schematic sectional views showing a procedure in which the selectively grown copper in the interconnections is subjected to a CMP process.
Figure 15B:
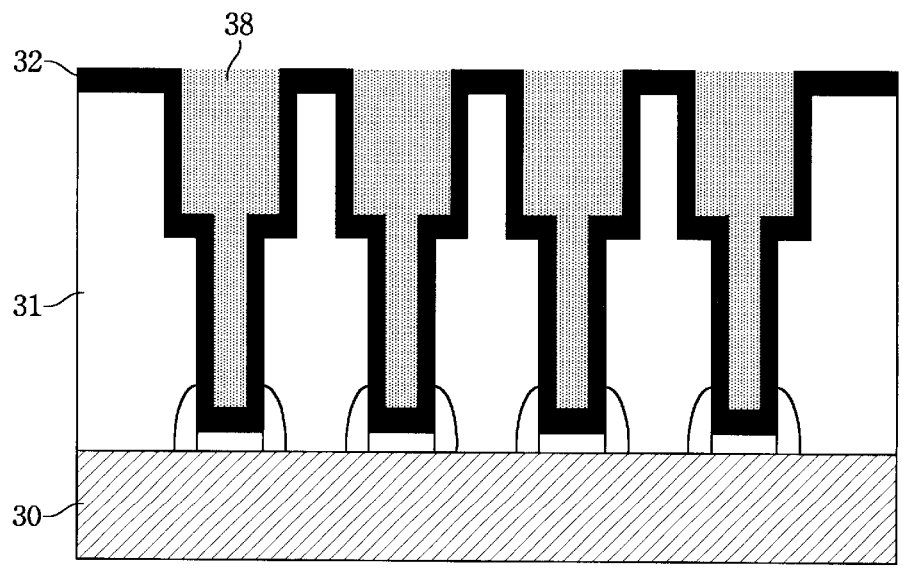

FIGS. 15A and 15B are schematic sectional views showing states in which the selectively grown copper in the interconnections is subjected to a CMP process. Referring to the drawings, copper is selectively grown only in corresponding interconnection regions (as indicated by reference numeral "37") and thus the CMP process becomes easier when the selective copper deposition as shown in FIG. 11 is applied to current copper multi-layer interconnection processes. This enables the copper interconnections 38 to be flattened more. Once again, reference numerals "30", "31" and "32" designates the silicon wafer, the interlayer dielectric film and the metal diffusion barrier layer, respectively.

As described above, a method for forming copper interconnections of a semiconductor component using an electroless plating system in accordance with the present invention requires a metal seed pretreating process as a preceding surface activation process for an electroless plating process. Nevertheless, since the method of the present invention does not employ vacuum processes for forming a metal seed layer as in electrolytic plating and the metal seed pretreating process is a wet process similar to the electroless plating process, it can be expected that the processes will be simplified and process costs will be considerably reduced.

Moreover, the method of the present invention enables the wafer planarization process, as a subsequent process, to be omitted by developing a process of selectively growing copper only in desired interconnections while advantages of the electroless plating are still kept. The wafer planarization process is costly and includes a number of accompanying processes. Therefore, if the selective copper growth of the present invention is practically applied to industrial processes, the overall number of metal interconnection process can be drastically reduced. Compared with the existing ultraviolet radiation photo process which has been proposed as a selective copper growth process, the selective copper growth process of the present invention has the advantage of being much simpler.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method for forming copper interconnections in a semiconductor component using an electroless plating system comprising:

a first step of cleaning a wafer in order to remove contamination sources and to allow uniform copper deposition;

a second step of pretreating the wafer with a metal seed solution so as to cause copper depositing regions to tend toward spontaneous catalytic activation and simultaneously varying a process temperature to grow metal seed particles from the metal seed pretreating solution, the metal seed particles having different bonding forces and sizes between on a wafer surface and in interconnection forming regions;

a third step of cleaning the wafer to remove the metal seed from the wafer surface; and a fourth step of plating a product obtained from the third step with an electroless plating bath to grow copper in the metal seed formed regions.

2. The method according to claim 1, wherein the first step comprises the sub-steps of:

removing organics and metallic contaminants formed on the wafer surface by cleaning the wafer using sulfuric acid and hydrogen peroxide in a weight ratio of 1 to 10:1 for a time of 1 to 10 minutes; and removing oxides formed on the wafer surface by cleaning the wafer using hydrofluoric acid and water in a weight ratio of 1 to 10:100 for a time of 1 to 2 minutes.

3. The method according to claim 1, wherein the metal seed used as the pretreating solution for selective copper deposition of the second step is any one selected from the group consisting of palladium (Pd), gold (Au), silver (Ag), tin (Sn), nickel (Ni), iron (Fe), copper (Cu) and platinum (Pt).

4. The method according to claim 1, wherein the metal seed pretreating solution using palladium is composed of a mixture of 0.01 to 0.1 g/l of palladium chloride ($PdCl_2$), 3 to 20 ml of ammonia water ($NH_4OH$) 1 to 20 ml of hydrochloric acid (HCl) and 1 to 10 ml of hydrofluoric acid (HF).

5. The method according to claim 4, wherein nitric acid ($HNO_3$), as a surface oxidant, is further added to and polyethyleneglycol (PEG) and Triton, as surfactants for stabilization of the solution, is further added to the metal seed pretreating solution.

6. The method according to claim 1, wherein the second step of pretreating the wafer with the metal seed is performed at the process temperature between 50 and 80° C., thereby causing only Pd metal particles of $Pd(NH_3)_2Cl_2$ within the solution to be grown on the surface.

7. The method according to claim 1, wherein depending upon the pretreating process temperature of the second step, nano size fine particles of several tens of nanometers are deposited at a normal temperature and the size of the nano size particles is increased up to a several hundreds of nanometers when the process temperature is between 50 and 80° C.

8. The method according to claim 1, wherein a procedure for preparing the electroless plating bath prior to the copper electroless plating of the fourth step comprises the steps of:

a) adding copper sulfate pentahydrate and EDTA to a water solvent and then stirring the solution to produce a solution;

b) adjusting solution pH to an alkaline state by TMAH prior to putting HCHO into the solution in order to prevent a side reaction by which HCHO is rapidly converted into methanol in an acidic state;
c) adding HCHO to a product obtained from step b);
d) putting other additives into the solution; and
e) adjusting solution pH to a value of 12 to 13 by TMAH(29) and then stirring the solution.

9. The method according to claim 1, wherein the copper electroless plating is conducted at a temperature between 50 and 80° C.

10. The method according to claim 1, wherein following the electroless plating process of the fourth step, a planarization (CMP) process is performed for posttreating processes.

* * * * *